(12) United States Patent
Oota et al.

(10) Patent No.: US 9,992,889 B2
(45) Date of Patent: Jun. 5, 2018

(54) LID OPENING/CLOSING MECHANISM AND ELECTRONIC DEVICE STORAGE CASE

(71) Applicant: YOKOGAWA ELECTRIC CORPORATION, Musashino-shi, Tokyo (JP)

(72) Inventors: Yasunori Oota, Tokyo (JP); Sunho You, Tokyo (JP); Takuya Nidaira, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 22 days.

(21) Appl. No.: 15/031,606

(22) PCT Filed: Sep. 29, 2014

(86) PCT No.: PCT/JP2014/075820
§ 371 (c)(1),
(2) Date: Apr. 22, 2016

(87) PCT Pub. No.: WO2015/064265
PCT Pub. Date: May 7, 2015

(65) Prior Publication Data
US 2016/0278224 A1 Sep. 22, 2016

(30) Foreign Application Priority Data

Oct. 28, 2013 (JP) ................................. 2013-223533

(51) Int. Cl.
*H05K 5/00* (2006.01)
*H05K 5/02* (2006.01)

(52) U.S. Cl.
CPC ............. *H05K 5/0247* (2013.01); *H05K 5/00* (2013.01); *H05K 5/0226* (2013.01); *H05K 5/0239* (2013.01)

(58) Field of Classification Search
USPC ....................................... 174/110 A; 312/110
See application file for complete search history.

(56) References Cited

U.S. PATENT DOCUMENTS 3,822,925 A * 7/1974 Osroff ....................... E06B 7/34
312/242
4,729,612 A * 3/1988 Stone ...................... E05D 15/58
312/109

(Continued)

FOREIGN PATENT DOCUMENTS

| JP | 49-40501 Y1 | 11/1974 |
| JP | 59-14377 U | 1/1984 |

(Continued)

*Primary Examiner* — William H Mayo, III
*Assistant Examiner* — Krystal Robinson
(74) *Attorney, Agent, or Firm* — Sughrue Mion, PLLC

(57) ABSTRACT

A lid opening/closing mechanism, which attaches a lid to an opening of a case body to be openable and closable, and holds a distribution cable electrically connecting the case body and the lid, includes a first member which is attachable to an attachment surface of the case body and slidable along the attachment surface, and a second member of which one side is rotatable and attachable to the first member, and of which another side is fixed to the lid, wherein the distribution cable is curved and held along the first member and the second member.

18 Claims, 11 Drawing Sheets

(56) References Cited

U.S. PATENT DOCUMENTS

| | | | | |
|---|---|---|---|---|
| 5,395,165 | A | * | 3/1995 | Woerner ................. E05D 15/58 211/27 |
| 7,959,453 | B2 | * | 6/2011 | Guering .............. E05D 11/0081 361/616 |
| 2001/0017214 | A1 | | 8/2001 | Saeki et al. |
| 2007/0157523 | A1 | | 7/2007 | Kuhnen et al. |
| 2008/0290769 | A1 | | 11/2008 | Guering |

FOREIGN PATENT DOCUMENTS

| | | |
|---|---|---|
| JP | 08-222861 A | 8/1996 |
| JP | 9-130062 A | 5/1997 |
| JP | 2001-177944 A | 6/2001 |
| JP | 2008-521230 A | 6/2008 |
| JP | 2010199102 A | 9/2010 |
| JP | 2011-249638 A | 12/2011 |

* cited by examiner

LID OPENING/CLOSING MECHANISM AND ELECTRONIC DEVICE STORAGE CASE

CROSS REFERENCE TO RELATED APPLICATIONS

This is a National Stage of International Application No. PCT/JP2014/075820 filed Sep. 29, 2014, claiming priority based on Japanese Patent Application No. 2013-223533 filed Oct. 28, 2013, the contents of all of which are incorporated herein by reference in their entirety.

TECHNICAL FIELD

The present invention relates to a lid opening/closing mechanism and an electronic device storage case.

BACKGROUND ART

A storage case of an electronic device, which is installed in the outdoors or under an environment of high humidity, has a structure which can seal an aperture plane of a case body with a lid so that the electronic device stored in the inside may not be influenced by moisture.

Conventionally, for example, a case opening/closing mechanism shown in the patent document 1 is mentioned as the storage case of the electronic device which can seal the inside. Invention described in the patent document 1 has a structure for moving the lid in parallel with a horizontal direction with respect to the case body and rotating the lid around a hinge axis. By the structure, the lid can be in close contact with the case body, and outside air and moisture can be prevented from entering into the case body.

On the other hand, in a case that a connector for connecting to the electronic device stored in the case body of the storage case, a display panel of the electronic device, an operation panel, and so on are mounted on an external surface of the lid, it is necessary that a distribution cable is disposed between the case body and the lid so that the lid can be opened and closed. As the storage case of the electronic device where the distribution cable is disposed between the case body and the lid, for example, an attachment device of the electronic device shown in the patent documents 2 is mentioned. According to the patent document 2, a main body and an attachment base can be rotated by a hinge member, and a connection lead connects between the electronic device in the main body and a wiring connection part of the attachment base. The connection lead is hanged down with excess length between the electronic device and the attachment base so that the electronic device and the attachment base can be rotated.

CITATION LIST

Patent Literature

[Patent document 1] Japanese patent application publication No. 2011-249638
[Patent document 2] Japanese patent application publication No. H08-222861

SUMMARY OF INVENTION

Technical Problem

However, in the case opening/closing mechanism disclosed in the above-described patent document 1, it is not supposed that a distribution cable is disposed between the lid and the case body. Therefore, in the patent document 1, a distribution cable for allowing the parallel movement and the rotation of the lid with respect to the case body is not disclosed at all.

On the other hand, in the attachment device of the electronic device disclosed in the patent document 2, the connection lead is disposed between the main body and the attachment base. However, in the patent document 2, the main body just rotates with respect to the attachment base, and a structure for moving the main body in parallel with the attachment base is not disclosed at all.

Moreover, since the connection lead described in the patent document 2 is hanged down between the electronic device and the attachment base, there is a problem of workability, for example, the connection lead interferes work when the electronic device is operated. Since a space for storing the connection lead is necessary to be large so that the connection lead can be hanged down between the main body and the attachment base, it is difficult to downsize the attachment device. In addition, it is necessary to provide a sleeve and a cableveyor (registered trademark) at a part where the connection lead hanged down with excess length, and there is also a problem of increasing manufacturing cost due to increase of components.

Solution to Problem

In order to solve the above problems, a lid opening/closing mechanism, which attaches a lid to an opening of a case body to be openable and closable, and holds a distribution cable electrically connecting the case body and the lid, includes a first member which is attachable to an attachment surface of the case body and slidable along the attachment surface, and a second member of which one side is rotatable and attachable to the first member, and of which another side is fixed to the lid, wherein the distribution cable is curved and held along the first member and the second member.

Moreover, in the lid opening/closing mechanism of the present invention, the first member and the second member are an integrated plate member, and a thinned part of which thickness is reduced is formed in a boundary between the first member and the second member.

Moreover, the lid opening/closing mechanism of the present invention further includes a cable holding member which faces the first member and the second member and holds the distribution cable, and a space for storing the distribution cable is formed between the cable holding member, the first member, and the second member.

Moreover, in the lid opening/closing mechanism of the present invention, the cable holding member includes a first part fixed to the first member and a second part rotatably engaged with the first part.

Moreover, in the lid opening/closing mechanism of the present invention, the first member and the first part included in the cable holding member is an integrated member.

Moreover, the lid opening/closing mechanism of the present invention further includes a pressing member which is attached to make the second part included in the cable holding member slidably follow the second member.

Moreover, in the lid opening/closing mechanism of the present invention, the cable holding member is a guide member which guides the distribution cable along a curved part of the distribution cable.

Moreover, in the lid opening/closing mechanism of the present invention, the distribution cable is held to be an approximately S-shape along the first member and the second member.

Moreover, the lid opening/closing mechanism of the present invention further includes a stopper member which is disposed in the attachment surface of the case body and the first member, the stopper member regulating a range of slide of the first member.

Moreover, in the lid opening/closing mechanism of the present invention, all of the first member, the second member, and the cable holding member are integrally molded by using resin.

Moreover, an electronic device storage case includes a case body which has an opening, a lid which is attached to the opening to be openable and closable, a distribution cable which electrically connects the case body and the lid, a first member which is attachable to an attachment surface of the case body and slidable along the attachment surface, and a second member of which one side is rotatable and attachable to the first member, and of which another side is fixed to the lid, wherein the distribution cable is curved and held along the first member and the second member.

Advantageous Effects of Invention

In the lid opening/closing mechanism and the electronic device storage case of the present invention, the first member is attachable to an attachment surface of the case body and slidable along the attachment surface, the second member of which one side is rotatable and attachable to the first member, and of which another side is fixed to the lid, and the distribution cable is curved and held along the first member and the second member. Thereby, the lid opening/closing mechanism can be positioned in a small space while allowing the lid to slide and rotate, and workability can be improved when the lid is opened and the electronic device is operated.

DESCRIPTION OF EMBODIMENTS

An aspect of some embodiments of the present invention is to provide a lid opening/closing mechanism and an electronic device storage case, which include a distribution cable between a case body and a lid, and can allow movement of the lid in a storage case in which the lid is slidable and rotatable with respect to the case body, can be positioned in a small space, and can improve workability when the lid is opened and the electronic device is operated.

Embodiments of a lid opening/closing mechanism and an electronic device storage case will be described below, with reference to drawings. The present embodiment is described specifically so that the meaning of the invention can be understood better, and the present invention is not limited unless otherwise specified. Moreover, in order to understand an aspect of the present invention easily, there is a case that drawings used for the description below illustrate an enlarged main part for convenience, and a dimensional ratio of each component is not necessarily the same as an actual ratio.

Figure 1:
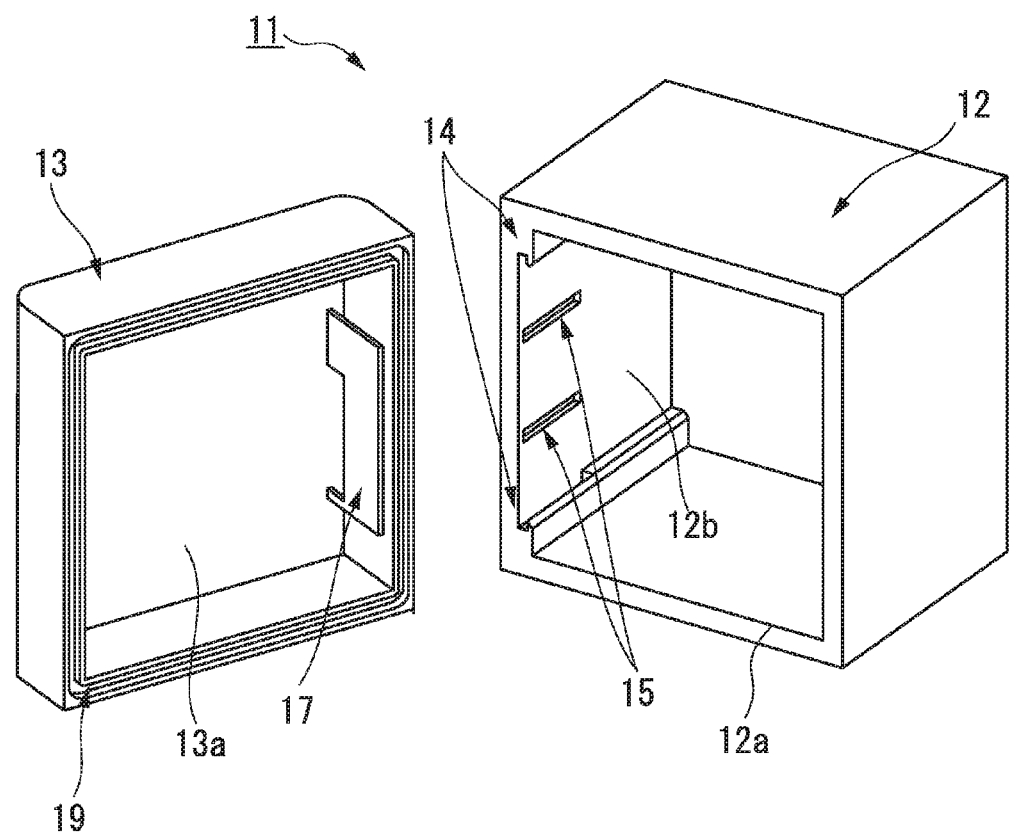
FIG. 1 is a perspective view illustrating a case.
Figure 2:
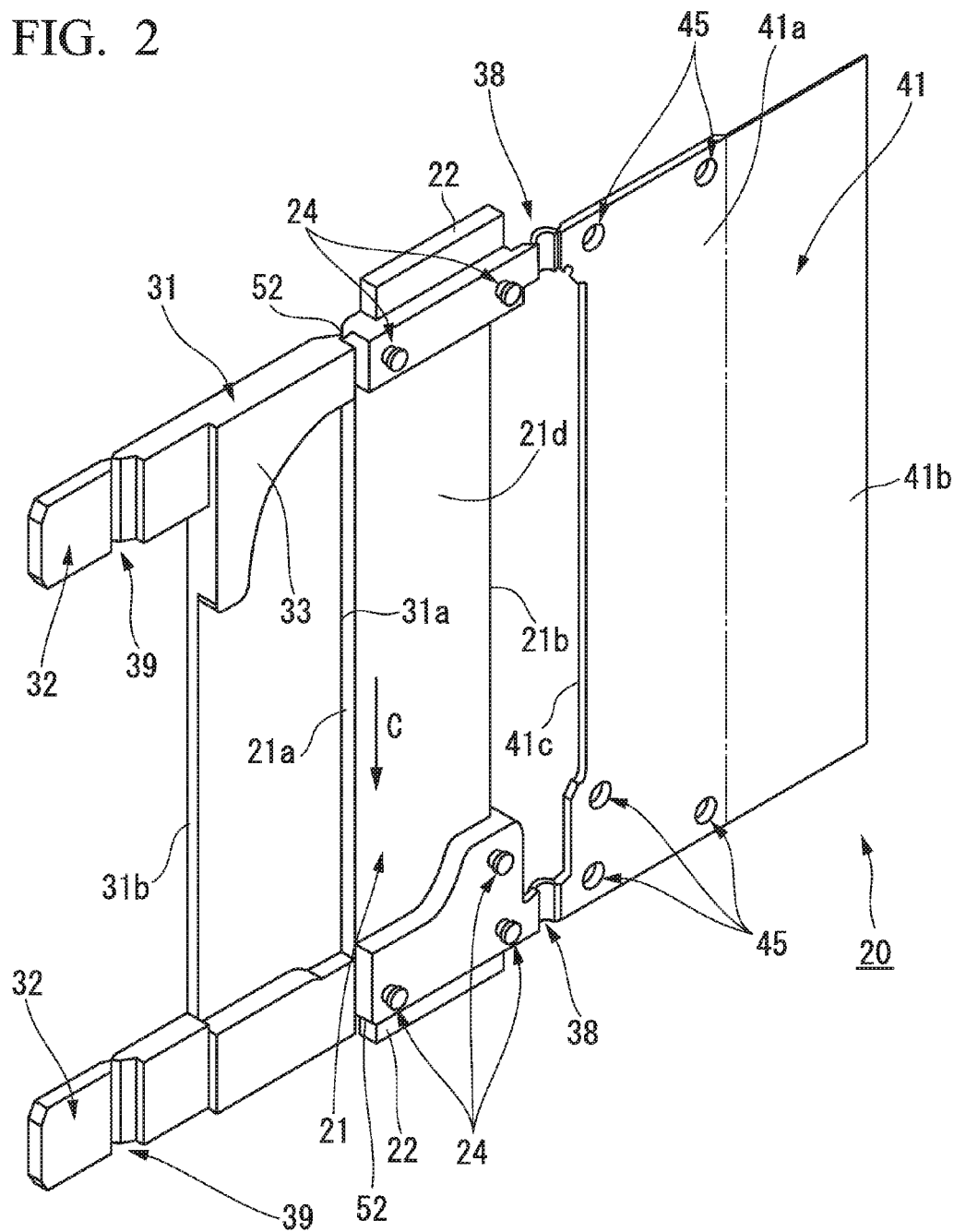
FIG. 2 is a perspective view illustrating an embodiment of a lid opening/closing mechanism of the present invention.
Figure 3:
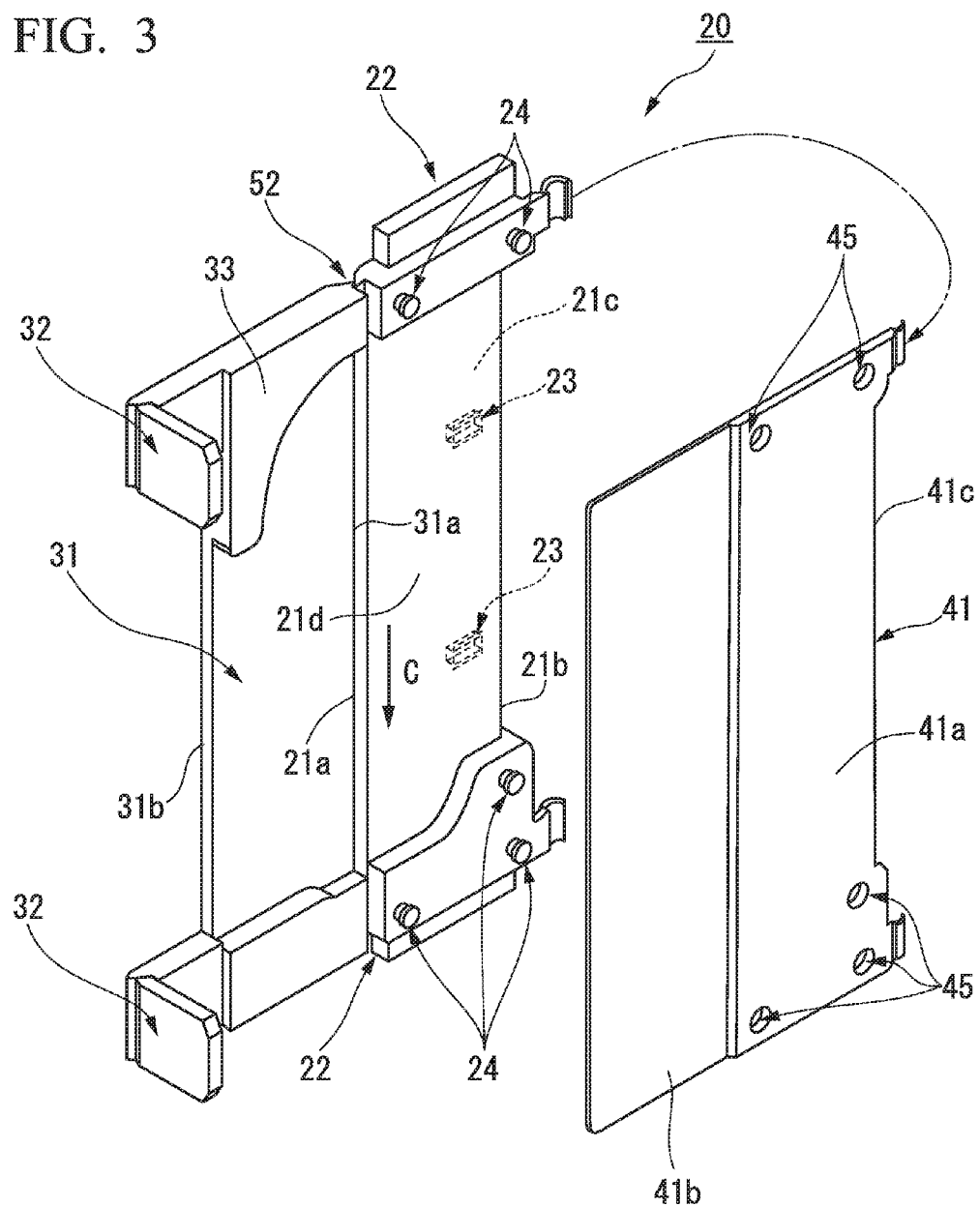
FIG. 3 is a disassembled perspective view illustrating an embodiment of the lid opening/closing mechanism of the present invention.
Figure 4A:
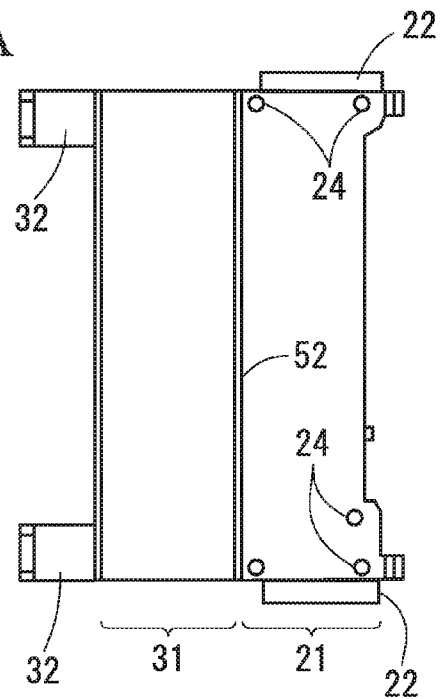
FIG. 4A is a plan view when the lid opening/closing mechanism is viewed from one side.
Figure 4B:
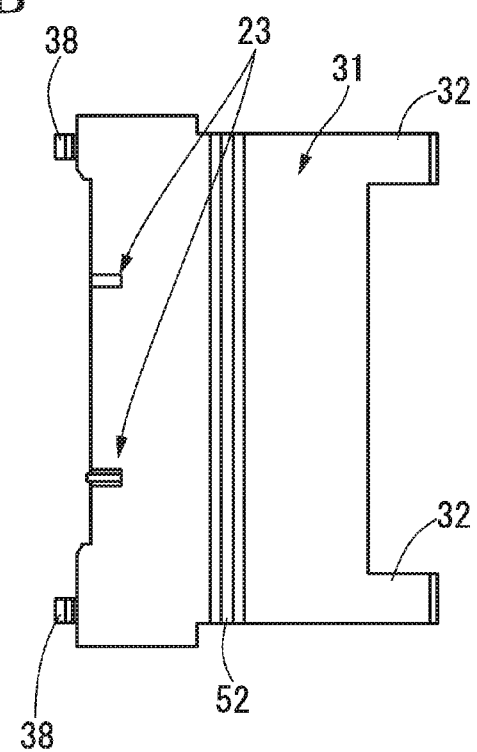
FIG. 4B is a plan view when the lid opening/closing mechanism is viewed from another side.
Figure 4C:
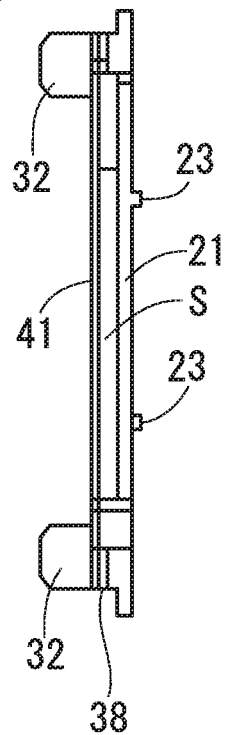
FIG. 4C is a side view of the lid opening/closing mechanism along a thickness direction.
Figure 4D:
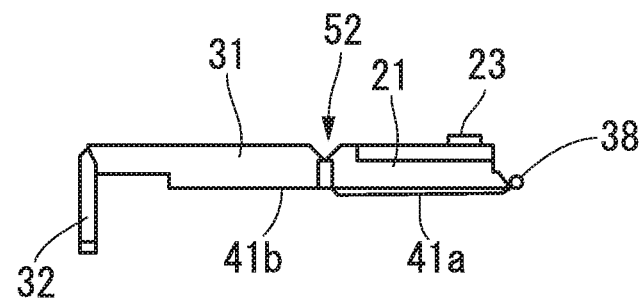
FIG. 4D is a top view of the lid opening/closing mechanism.

FIG. 1 is a perspective view illustrating a case in which a lid opening/closing mechanism of the present invention is attached. FIG. 2 is a perspective view illustrating a state before the lid opening/closing mechanism of the present invention is used. FIG. 3 is a disassembled perspective view illustrating a state when the lid opening/closing mechanism of the present invention is used. FIG. 4A is a plan view when the lid opening/closing mechanism is viewed from one side. FIG. 4B is a plan view when the lid opening/closing mechanism is viewed from another side. FIG. 4C is a side view of the lid opening/closing mechanism. FIG. 4D is a top view of the lid opening/closing mechanism.

The case 11 includes a case body 12 and a lid 13. For example, the case body 12 is a cuboid-shaped hollow box, and an opening 12a is formed at one side of the case body 12.

The lid 13 has a structure which can seal the opening 12a of the case body 12. The lid 13 is connected to the case body 12 by a lid opening/closing mechanism 20. A waterproof seal component 19, such as packing, may be disposed between the opening 12a of the case body 12 and the lid 13.

An attachment slot 14 is formed in an upper side and a lower side of the attachment surface 12b of the case body 12 to which the lid opening/closing mechanism 20 is attached. The attachment slot 14 makes it possible that the lid opening/closing mechanism 20 engages and slides along the attachment surface 12b. Slide slots 15 are formed in the attachment surface 12b of the case body 12. The slide slots 15 are stopper components for regulating slide range of the lid opening/closing mechanism 20.

A pressing member 17 is formed on an inner surface 13a of the lid 13. The pressing member 17 allows a second part 41b of a cable holding member 41 described later to rotate in order to follow a second member 31. The pressing member 17 makes it possible that the second part 41b slides in order to follow the second member 31. Thereby, the second part 41b rotates following the rotation of the second member 31.

The lid opening/closing mechanism 20 of the present invention includes a first member 21, a second member 31, and a cable holding member 41. For example, the first member 21, the second member 31, and the cable holding member 41 are molded as an integrated resin member. If whole of the lid opening/closing mechanism 20 is integrally formed by injection molding, the lid opening/closing mechanism 20 can be easily manufactured at low cost.

The first member 21 is a plate-shaped member. The second member 31 is connected to one side 21a of the first member 21. The cable holding member 41 is connected to another side 21b of the first member 21. Ridges 22 are formed on the upper end and the lower end of the first member 21 respectively. The ridges 22 respectively fit into the attachment slots 14 formed in the attachment surface 12b of the case body 12. Slide projections 23 are formed on one side 21c where the first member 21 faces to the attachment surface 12b of the case body 12. The slide projections 23 respectively fit into the slide slots 15 formed in the attachment surface 12b of the case body 12.

The attachment slots 14 respectively slide and fit to the ridge 22 so that the lid opening/closing mechanism 20 can slide along the attachment surface 12b of the case body 12. The slide range of the lid opening/closing mechanism 20 is regulated by the slide slots 15 and a stopper member within the length range of the slide slots 15. The stopper member includes the slide projections 23 respectively fitting into the slide slots 15. Thereby, the lid opening/closing mechanism 20 can be prevented from dropping from the case body 12.

Moreover, engaging projections 24 are formed on another side 21d of the first member 21. The engaging projections 24 respectively fit into engaging holes 45 formed in a cable holding member 41 described later. The ridges 22, the slide projections 23, the engaging projections 24 may be formed integrally as a part of the first member 21.

The second member 31 is a plate member formed integrally with the first member 21. The side 31a of the second member 31 is rotatably mounted with respect to the side 21a of the first member 21. A bottomed groove which extends along the vertical direction C of the plate member is formed in the boundary of the second member 31 and the first member 21. The bottom of the groove is a thinned part 52 which is thinner than other parts of the second member 31 and the first member 21.

The thinned part 52 makes it possible that the second member 31 is rotated around the vertical direction C as a rotational axis with respect to the first member 21. As the groove formed in the boundary (rotating part) between the second member 31 and the first member 21, for example, a V-shaped groove and a U-shaped groove are given.

Attachments 32 are formed integrally with another side 31b of the second member 31. The lid 13 is fixed to the attachments 32. For example, the second member 31 is attached vertically to the inner surface 13a of the lid 13. A fixing method of the second member 31 and the lid 13 is not limited to a specific method. For example, a screw hole may be formed in the attachment 32 of the second member 31, and the attachment 32 and the lid 13 are fixed by a screw through the screw hole. The attachment 32 has a shape which can be folded at right angle with respect to the surface of the second member 31 by a thinned part 39 in which a groove is formed between the attachment 32 and the second member 31.

A guide member 33, which is along a curved part of the distribution cable described later, is formed integrally on the upper side of the second member 31. The guide member 33 prevents that the distribution cable is folded in an unexpected direction and deviates greatly from the lid opening/closing mechanism 20.

The cable holding member 41 is a plate member formed integrally with the first member 21, and has a first part 41a and a second part 41b. The cable holding member 41 is attached to the other side 21b of the first member 21 at an upper end and a lower end of the end side 41c of the cable holding member 41. For example, a connection part 38 between the cable holding member 41 and the first member 21 is thinner and narrower than other parts of the cable holding member 41. Thereby, the cable holding member 41 can be rotated (folded) from a position parallel to the first member 21 in a plane (FIG. 2), to a position facing the other side 21d of the first member 21 (FIG. 3).

In addition, in the present embodiment, an example of the cable holding member 41 formed integrally with the first member 21 through the connection section 38 is described. However, the cable holding member 41 may be molded separately from the first member 21, and attached so that the first member 21 faces the first part 41a and the second part 41b.

Figure 5A:
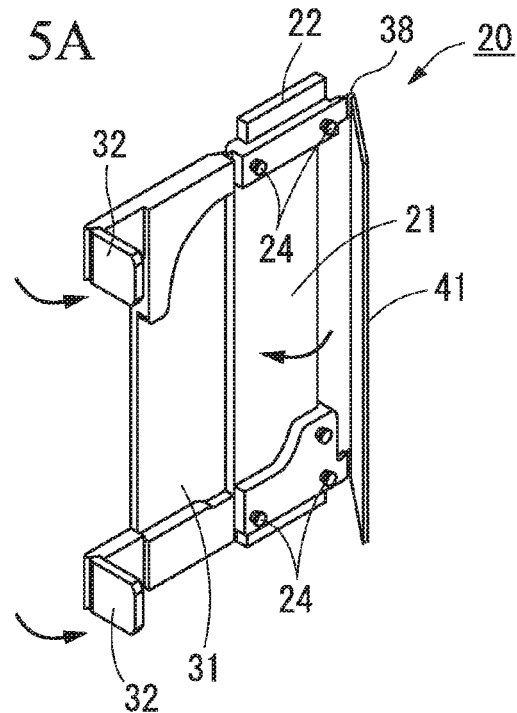
FIG. 5A is a perspective view illustrating an embodiment of a cable holding member.

At a time of forming (manufacturing), the lid opening/closing mechanism 20 is formed integrally in a state that the cable holding member 41 is parallel to the first member 21 in a plane. At a time of using the lid opening/closing mechanism 20, as shown in FIG. 5A, the cable holding member 41 is rotated with respect to the first member 21 so as to be folded.

Figure 5B:
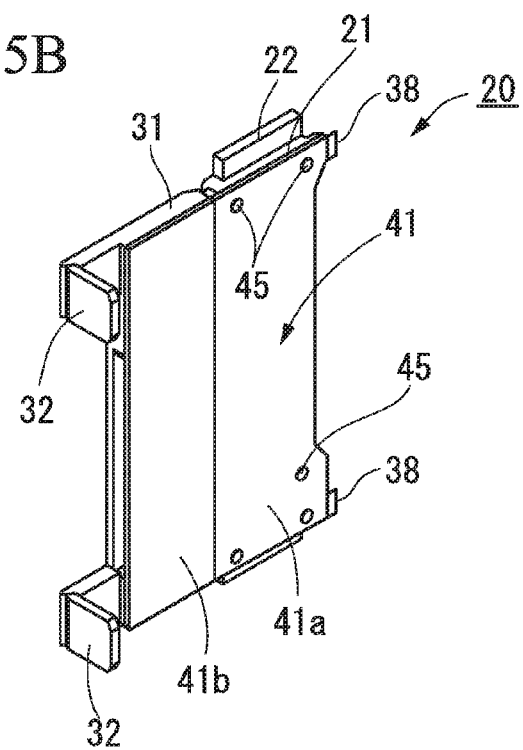
FIG. 5B is a perspective view illustrating an embodiment of a cable holding member.

As shown in FIG. 5B, the first part 41a of the cable holding member 41 faces the other side 21d of the first member 21, and these are overlapped. Thereby, the engaging projections 24 of the first member 21 respectively fit into the engaging holes 45 formed in the first part 41a. An end part of the engaging projection 24 is slightly larger than the diameter of the opening of the engaging hole 45. The end part of the engaging projection 24 is made of resin, and the engaging projection 24 fits into the engaging hole 45 and it is fixed by elasticity of the resin.

In this way, the engaging projection 24 fits into the engaging hole 45 so that the first part 41a of the cable holding member 41 is fixed to the first member 21. Moreover, the engaging projection 24 fits into the engaging hole 45 so that a cable storing space S which is a wiring duct storing the distribution cable described later is formed between the cable holding member 41 and the first member 21.

The second part 41b included in the cable holding member 41 is formed so as to be thinner than the first part 41a. The second part 41b is rotatable around the boundary between the first part 41a and the second part 41b as a rotational axis with respect to the first part 41a.

The second part 41b included in the cable holding member 41 engages with the pressing member 17 of which end side was formed on the inner surface 13a of the lid 13. Further, when the lid 13 is rotated, the second part 41b is rotated so as to follow the second member 31 in a state that the second part 41b is engaged with the pressing member 17.

That is, the pressing member 17 makes it possible that the second part 41b slidably follows to the second member. Thereby, the second part 41b also rotates so as to follow the rotation of the second member 31.

Figure 6A:
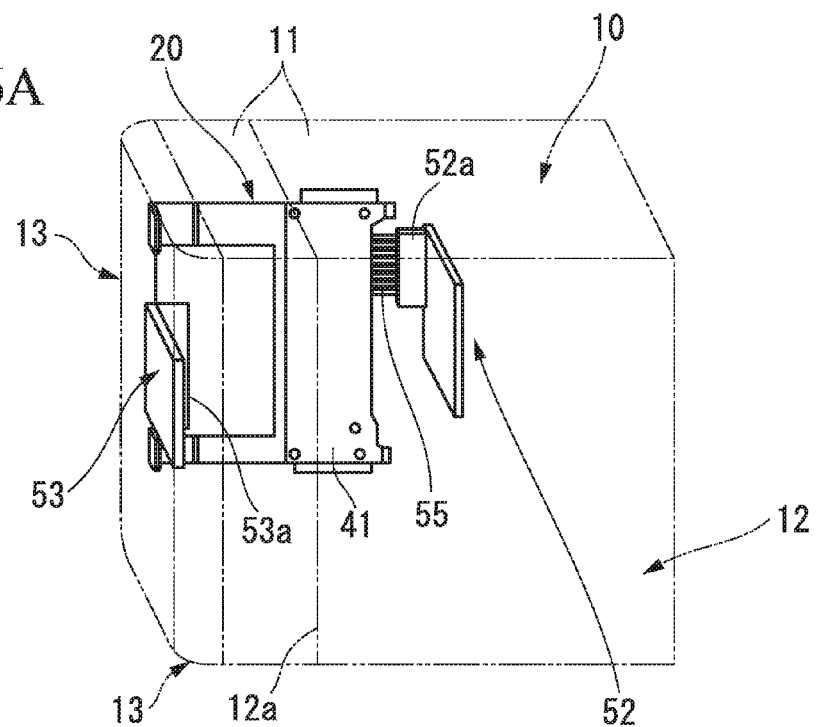
FIG. 6A is a drawing illustrating an electronic device storage case equipped with the lid opening/closing mechanism.
Figure 6B:
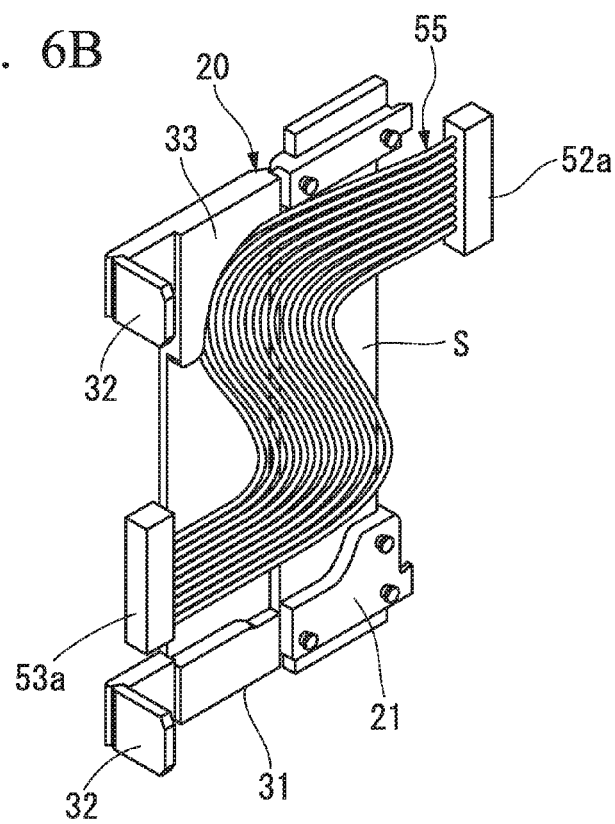
FIG. 6B is a perspective view illustrating a state of the distribution cable stored in the lid opening/closing mechanism.

FIG. 6A is a drawing illustrating an electronic device storage case equipped with the lid opening/closing mechanism. FIG. 6B is a perspective view illustrating a state of the distribution cable stored in the lid opening/closing mechanism. As shown in FIG. 6A, the electronic device storage case 10 includes the case 11 and the lid opening/closing mechanism 20. A circuit substrate 52 is disposed in the case body 12 of the case 11. A circuit substrate 53 is disposed on the lid 13 of the case 11.

For example, the circuit substrate 52 disposed in the case body 12 is a main part of the electronic device. For example, the circuit substrate 53 disposed on the lid 13 may be a control circuit of an operation panel for operating the electronic device from outside of the case 11 and a display which displays a state of the electronic device to outside of the lid 13. The connector 52a of the circuit substrate 52 disposed in the case body 12 and the connector 53a of the circuit substrate 53 disposed on the lid 13 are electrically connected to each other by the distribution cable 55.

As shown in FIG. 6B, the distribution cable 55 has a plurality of thin wires arranged in parallel, and the distribution cable 55 is made of material which can be curved flexibly. The distribution cable 55 is curved between the connector 52a and the connector 53a, and stored in the cable storing space S of the lid opening/closing mechanism 20. For example, the distribution cable 55 is curved to an approximately S-shape along the first member 21 and the second member 31 of the lid opening/closing mechanism 20, and the distribution cable 55 is arranged with an excess length. The distribution cable 55 is arranged so that the curved part is along the guide member 33. Moreover, the distribution cable 55 is regulated by the cable holding member 41 so as not to be separated greatly from the first member 21 and the second member 31.

That is, the distribution cable 55 is arranged in the narrow cable storing space S formed between the first member 21 and the second member 31 and the cable holding member 41 facing them, so that the distribution cable 55 is curved by the guide member 33 to an approximately S-shape along the first member 21 and the second member 31. If the lid 13 is opened or closed, the distance between the circuit substrate 52 and the circuit substrate 53 varies. Therefore, the length between the connector 52a and the connector 53a of the distribution cable 55 has a length for the variation of the distance and a length for maintaining the curved state of the distribution cable 55 after the lid 13 is opened, as the excess length.

Figure 7A:
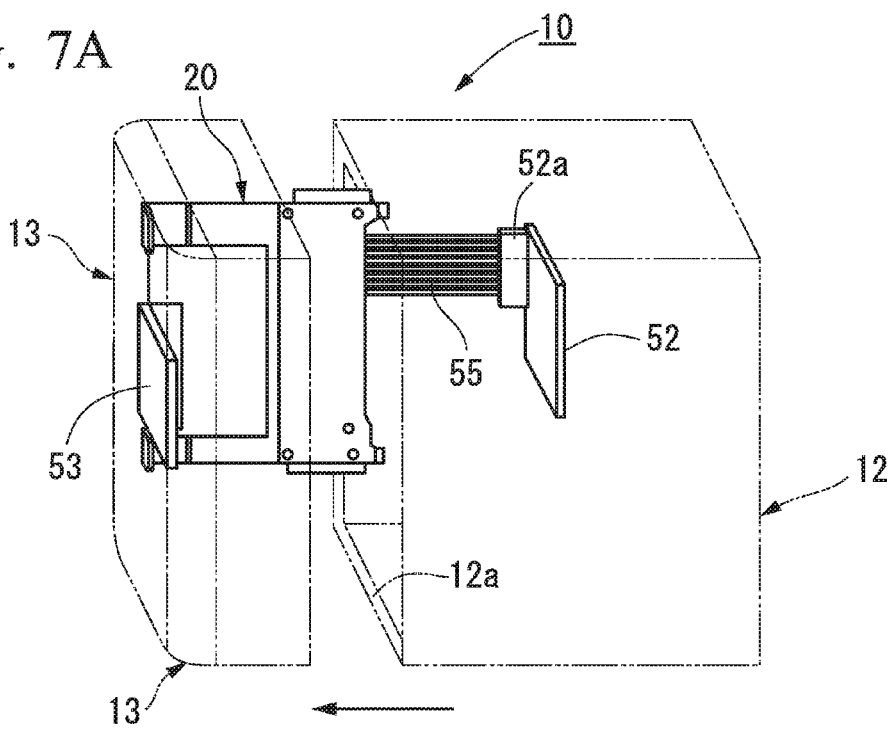
FIG. 7A is a drawing illustrating an electronic device storage case equipped with the lid opening/closing mechanism.
Figure 7B:
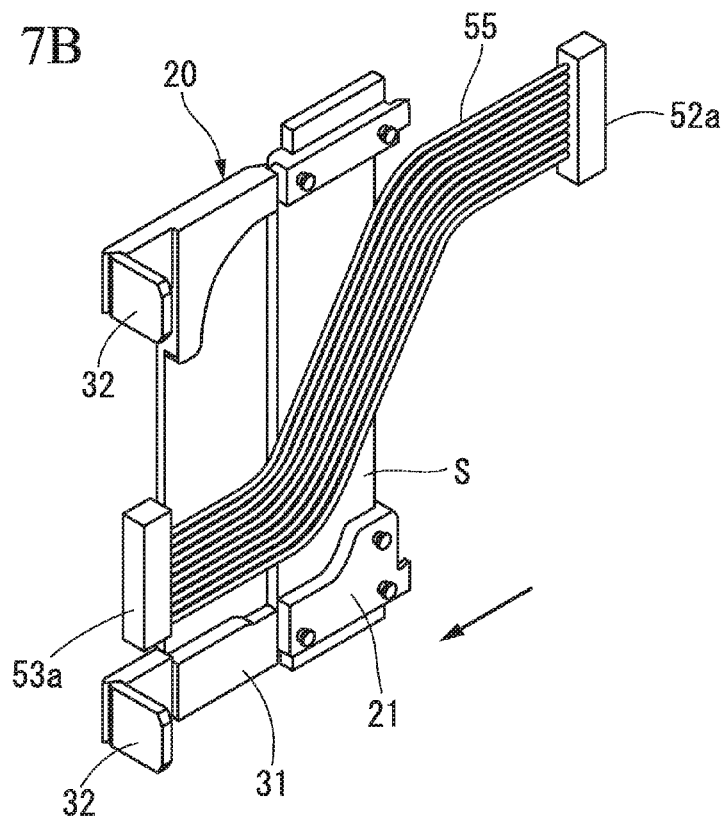
FIG. 7B is a perspective view illustrating a state of the distribution cable stored in the lid opening/closing mechanism.
Figure 8A:
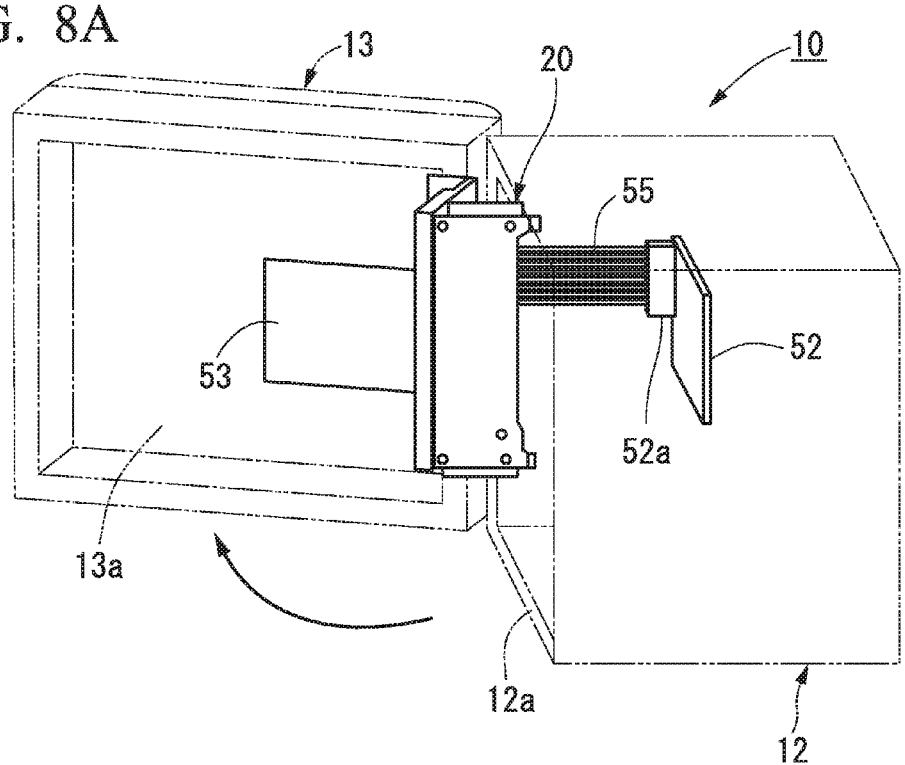
FIG. 8A is a drawing illustrating an electronic device storage case equipped with the lid opening/closing mechanism.
Figure 8B:
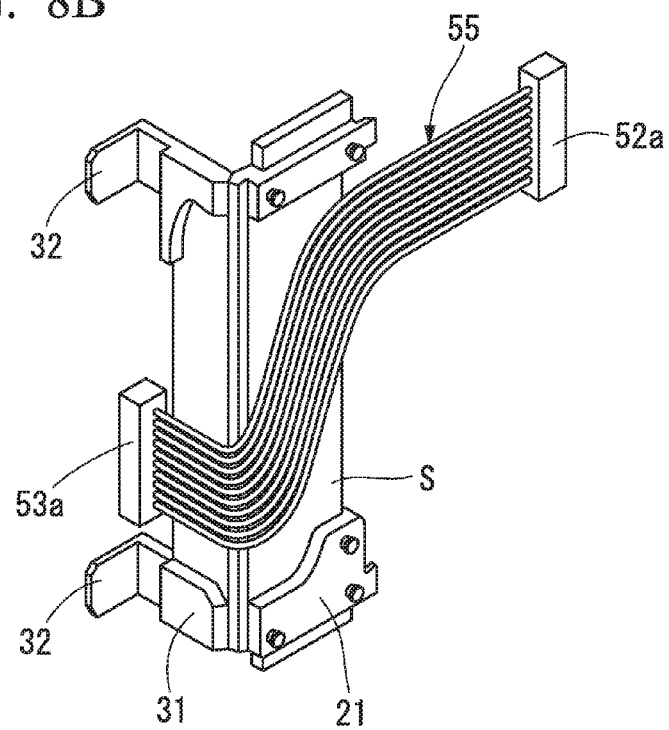
FIG. 8B is a perspective view illustrating a state of the distribution cable stored in the lid opening/closing mechanism.

Behavior of the electronic device storage case equipped with the lid opening/closing mechanism of the above-described configuration will be described. In the following description, operation of the lid opening/closing mechanism will be described. As shown in FIG. 6A and FIG. 6B, the lid of the electronic device storage case is closed. As shown in FIG. 7A and FIG. 7B, the lid is slid and pulled out. As shown in FIG. 8A and FIG. 8B, the lid is rotated and completely opened.

As shown in FIG. 6A, in a state where the lid 13 of the electronic device storage case 10 is closed (in a state where the lid 13 covers the opening 12a of the case body 12), the first member 21 and the second member 31 of the lid opening/closing mechanism 20 are arranged in a same plane. As shown in FIG. 6B, the distribution cable 55 stored in the cable storing space S is greatly curved to an approximately S-shape along the first member 21 and the second member 31. An outermost peripheral part in the curved part of the distribution cable 55 is held so that the S-shape can be kept by the guide member 33.

Operation of opening the lid 13 from a closed position of the lid 13 will be described. First, as shown in FIG. 7A, a worker slides the lid 13 so as to pull it out from the case body 12. With the slide of the lid 13, the ridges 22 formed on the first member 21 are slid along the attachment slots 14 formed in the attachment surface 12b of the case body 12 (FIG. 1 and FIG. 2). The slide range of the lid 13 is regulated in a range where the slide projection 23 formed on the first member 21 can fit into the slide slot 15 formed in the attachment surface 12b of the case body 12 (FIG. 1 and FIG. 2). For this reason, the lid 13 is not dropped from the case body 12 when the lid 13 slides.

If the worker slides the lid 13 so as to pull it out from the case body 12, as shown in FIG. 7B, the distance between the connector 52a and the connector 53a of the distribution cable 55 is increased. Accordingly, the excess length which is the curved part of the distribution cable 55 is stretched, and the curvature radius of the curved portion is changed. However, even if the lid 13 is pulled out completely from the case body 12, the excess length of the distribution cable 55 is long enough to keep the curved state of the distribution cable 55. For this reason, the distribution cable 55 is held along the first member 21 and the second member 31 in a state where the curved state is kept while changing the curvature radius.

Next, as shown in FIG. 8A, the worker rotates the lid 13 with respect to the case body 12 in order to expose the opening 12a of the case body 12. Thus, if the worker does not slide the lid 13 and does not pull it from the case body 12, the lid 13 cannot be rotated. Thereby, it can be prevented that the lid 13 rotates against intention of the worker. If the lid 13 is rotated, the second member 31 is folded around the thinned part 52 (FIG. 2), which is a bottom of the groove formed in the boundary between the second member 31 and the first member 21 of the lid opening/closing mechanism 20, as a rotational axis with respect to the first member 21.

Figure 9:
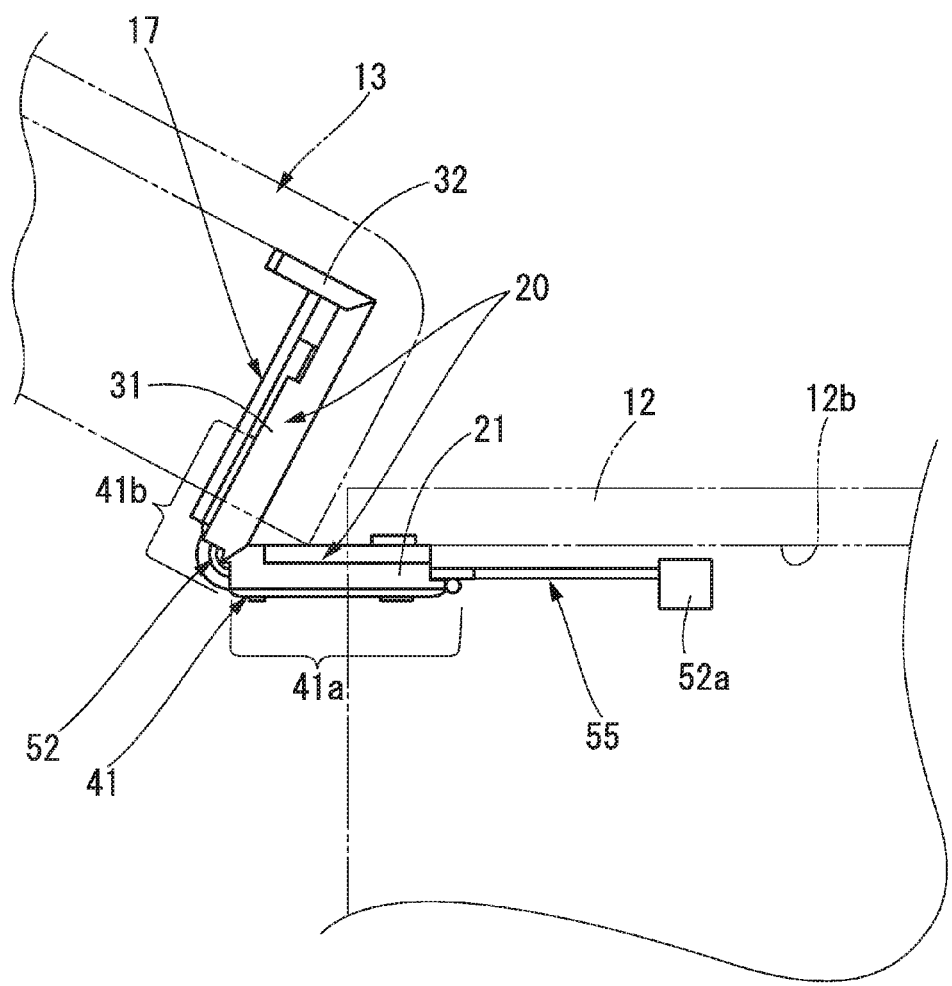
FIG. 9 is a drawing illustrating movement of the cable holding member.

At this time, as shown in FIG. 9, the second part 41b of the cable holding member 41 which faces the second member 31 is rotated so as to follow the rotation of the second member 31. This is because the second part 41b is rotatable with respect to the first part 41a which is fixed to the first member 21, and an end part of the second part 41b is engaged with the pressing member 17 formed on the inner surface 13a of the lid 13. That is, since the pressing member 17 is engaged with the second part 41b of the cable holding member 41, if the lid 13 is rotated, the second part 41b is also rotated while sliding against the pressing member 17.

By the mechanism, wherever the first member 21 and the second member 31 are positioned, the distribution cable 55 is covered with the cable holding member 41. For example, in the opened position of the lid 13 shown in FIG. 8A, the cable storing space S is curved in accordance with the curved shape of the second member 31 with respect to the first member 21.

If the lid 13 is rotated, as shown in FIG. 8B, the distribution cable 55 is curved along the second member 31 which is curved from the first member 21 in the cable storing space S. Even if the distribution cable 55 is curved as such, the first member 21 and the second member 31 are covered with the cable holding member 41. For this reason (FIG. 9), the distribution cable 55 does not lose greatly touch with the lid opening/closing mechanism 20, and the distribution cable 55 is kept to be along the first member 21 and the second member 31.

As described above, according to the lid opening/closing mechanism 20 and the electronic device storage case 10 in the present invention, when the worker slides and rotates the lid 13, the distribution cable 55 can follow the movement of the lid opening/closing mechanism 20 while the distribution cable 55 is along the first member 21 and the second member 31 which are hinges. Thereby, the distribution cable 55 can be stored efficiently in the space of the lid opening/closing mechanism 20, and the internal space of the electronic device storage case 10 can be used effectively. Since whole of the lid opening/closing mechanism 20 can be molded integrally by using resin, the lid opening/closing mechanism which has the distribution cable can be realized with a few components and at low cost.

The above-described embodiment is an embodiment of the lid opening/closing mechanism of the present invention, and a configuration of each part is not limited unless otherwise described.

Figure 10:
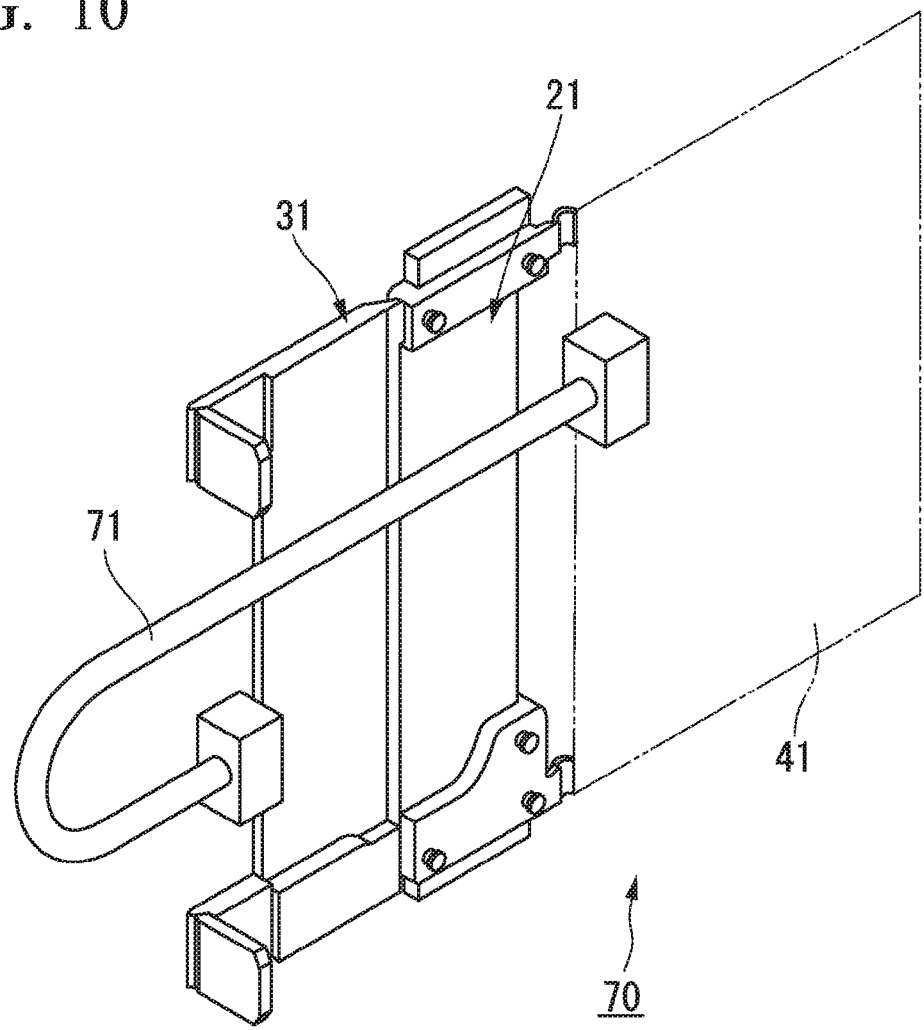
FIG. 10 is a perspective view illustrating another embodiment of a lid opening/closing mechanism of the present invention.

FIG. 10 is a plan view illustrating another embodiment of a lid opening/closing mechanism of the present invention. In the lid opening/closing mechanism 70 shown in FIG. 10, a cylinder type cable in which a plurality of wires is stored as a distribution cable 71 is adopted. The distribution cable 71 is along the first member 21 and the second member 31 with an excess part curved to an approximately U-shaped. In this way, if the distribution cable is made of flexible material which can follow the slide and the curve of the lid opening/closing mechanism, a shape and a number of the distribution cable are not limited. Furthermore, if the distribution cable is curved along the first member and the second member, the curved shape of the excess length part of the distribution cable is not limited.

In the above-described embodiment, although each of the first member and the second member is a plate member, for example, a frame member can be also used desirably to realize weight reduction and cost reduction.

In the above-described embodiment, although the cable holding member is a plate member facing the first member and the second member, a linear support member, which prevents from greatly losing touch with the first member and the second member while the distribution cable is allowed to slide, may be disposed on a part of the first member and the second member.

In the above-described embodiment, although the rotation part of the first member and the second member is realized by the thinned part formed by the groove, for example, a hinge including a rotation shaft and a bearing may be used.

In the above-described embodiment, although the lid opening/closing mechanism is integrally molded by using resin material, for example, it may be made of metal material or combination of various types of materials.

REFERENCE SIGNS LIST

10 Electronic device storage case
12 Case body
13 Lid
20 Lid opening/closing mechanism
21 First member
31 Second member
41 Cable holding member
55 Distribution cable
S Cable storing space

The invention claimed is:

1. A lid opening/closing mechanism, which is for attaching a lid to an opening of a case body to be openable and closable, and holding a distribution cable electrically connecting between the case body and the lid, comprising:
 a first member which is attachable to an attachment surface of the case body and slidable along the attachment surface; and
 a second member of which one side is rotatable and attachable to the first member, and of which another side is fixed to the lid,
 wherein the distribution cable is curved and held along the first member and the second member,
 wherein the first member and the second member are an integrated plate member, and
 wherein a thin part of which thickness is reduced is formed in a boundary between the first member and the second member.

2. The lid opening/closing mechanism according to claim 1, further comprising:
 a cable holding member which faces the first member and the second member and holds the distribution cable,
 wherein a space for storing the distribution cable is formed between the cable holding member, the first member, and the second member.

3. The lid opening/closing mechanism according to claim 1,
 wherein a guide member which guides the distribution cable is formed on the second member along a curved part of the distribution cable.

4. The lid opening/closing mechanism according to claim 1,
 wherein the distribution cable is held to be an approximately S-shape along the first member and the second member.

5. The lid opening/closing mechanism according to claim 1, further comprising:
 a slide projection which is disposed on the first member and engaged with a slide slot formed in the attachment surface of the case body.

6. A lid opening/closing mechanism, which is for attaching a lid to an opening of a case body to be openable and closable, and holding a distribution cable electrically connecting between the case body and the lid, comprising:
 a first member which is attachable to an attachment surface of the case body and slidable along the attachment surface;
 a second member of which one side is rotatable and attachable to the first member, and of which another side is fixed to the lid, and
 a cable holding member which faces the first member and the second member and holds the distribution cable,
 wherein the distribution cable is curved and held along the first member and the second member,
 wherein a space for storing the distribution cable is formed between the cable holding member, the first member, and the second member, and
 wherein the cable holding member includes a first part fixed to the first member and a second part rotatably engaged with the first part.

7. The lid opening/closing mechanism according to claim 6,
 wherein the first member and the first part included in the cable holding member is an integrated member.

8. The lid opening/closing mechanism according to claim 6, further comprising:

a pressing member which is attached to make the second part included in the cable holding member slidably follow the second member.

9. A lid opening/closing mechanism, which is for attaching a lid to an opening of a case body to be openable and closable, and holding a distribution cable electrically connecting between the case body and the lid, comprising:
a first member which is attachable to an attachment surface of the case body and slidable along the attachment surface;
a second member of which one side is rotatable and attachable to the first member, and of which another side is fixed to the lid; and
a cable holding member which faces the first member and the second member and holds the distribution cable,
wherein the distribution cable is curved and held along the first member and the second member,
wherein a space for storing the distribution cable is formed between the cable holding member, the first member, and the second member, and
wherein all of the first member, the second member, and the cable holding member are integrally molded by using resin.

10. An electronic device storage case comprising:
a case body which has an opening;
a lid which is attached to the opening to be openable and closable;
a distribution cable which electrically connects the case body and the lid;
a first member which is attachable to an attachment surface of the case body and slidable along the attachment surface; and
a second member of which one side is rotatable and attachable to the first member, and of which another side is fixed to the lid,
wherein the distribution cable is curved and held along the first member and the second member,
wherein the first member and the second member are an integrated plate member, and
wherein a thin part of which thickness is reduced is formed in a boundary between the first member and the second member.

11. The electronic device storage case according to claim 10, further comprising:
a cable holding member which faces the first member and the second member and holds the distribution cable,
wherein a space for storing the distribution cable is formed between the cable holding member, the first member, and the second member.

12. The electronic device storage case according to claim 11,
wherein a guide member which guides the distribution cable is formed on the second member along a curved part of the distribution cable.

13. The electronic device storage case according to claim 10,
wherein the distribution cable is held to be an approximately S-shape along the first member and the second member.

14. The electronic device storage case according to claim 10, further comprising:
a slide projection which is disposed on the first member and engaged with a slide slot formed in the attachment surface of the case body.

15. An electronic device storage case comprising:
a case body which has an opening;
a lid which is attached to the opening to be openable and closable;
a distribution cable which electrically connects the case body and the lid;
a first member which is attachable to an attachment surface of the case body and slidable along the attachment surface;
a second member of which one side is rotatable and attachable to the first member, and of which another side is fixed to the lid; and
a cable holding member which faces the first member and the second member and holds the distribution cable,
wherein the distribution cable is curved and held along the first member and the second member,
wherein a space for storing the distribution cable is formed between the cable holding member, the first member, and the second member, and
wherein the cable holding member includes a first part fixed to the first member and a second part rotatably engaged with the first part.

16. The electronic device storage case according to claim 15,
wherein the first member and the first part included in the cable holding member is an integrated member.

17. The electronic device storage case according to claim 15, further comprising:
a pressing member which is attached to make the second part included in the cable holding member slidably follow the second member.

18. An electronic device storage case comprising:
a case body which has an opening;
a lid which is attached to the opening to be openable and closable;
a distribution cable which electrically connects the case body and the lid;
a first member which is attachable to an attachment surface of the case body and slidable along the attachment surface;
a second member of which one side is rotatable and attachable to the first member, and of which another side is fixed to the lid; and
a cable holding member which faces the first member and the second member and holds the distribution cable,
wherein the distribution cable is curved and held along the first member and the second member,
wherein a space for storing the distribution cable is formed between the cable holding member, the first member, and the second member, and
wherein all of the first member, the second member, and the cable holding member are integrally molded by using resin.

* * * * *